United States Patent [19]

Fukushima et al.

[11] Patent Number: 5,565,709

[45] Date of Patent: Oct. 15, 1996

[54] SEMICONDUCTOR DEVICE

[75] Inventors: Takashi Fukushima; Satoshi Ito; Makoto Kuwamura; Shinya Akizuki; Kazuhiro Ikemura; Shinichiro Sudo, all of Osaka, Japan

[73] Assignee: Nitto Denko Corporation, Osaka, Japan

[21] Appl. No.: 551,941

[22] Filed: Nov. 2, 1995

[30] Foreign Application Priority Data

Nov. 10, 1994 [JP] Japan .................................. 6-276775

[51] Int. Cl.[6] .............................. H01L 23/28; H01L 23/29
[52] U.S. Cl. .......................... 257/787; 257/793; 257/788
[58] Field of Search .................................... 257/787, 788, 257/793

[56] References Cited

U.S. PATENT DOCUMENTS 5,107,327  4/1992  Nishimori et al. ...................... 257/793
5,218,030  1/1993  Katayose et al. .

Primary Examiner—Sara W. Crane
Assistant Examiner—S. V. Clark
Attorney, Agent, or Firm—Sughrue, Mion, Zinn, Macpeak & Seas

[57] ABSTRACT

A semiconductor device comprising a semiconductor element encapsulated with a cured resin having at least two secondary differential peaks of linear thermal expansion by a thermomechanical analytical measurement, the interval between the peaks being at least 20° C. The semiconductor device encapsulated with the cured resin does not cause a warp and is excellent in the TCT test characteristics and the cracking resistance.

5 Claims, 3 Drawing Sheets

SEMICONDUCTOR DEVICE

FIELD OF THE INVENTION

The present invention relates to a semiconductor device wherein a semiconductor element is encapsulated with a cured resin, and more specifically to a semiconductor device excellent in the reliability without causing warp.

BACKGROUND OF THE INVENTION

Recently, with the increase of the degree of integration and smaller sizing of semiconductor elements, the packaging (encapsulating) technology of semiconductor elements in the field of semiconductor devices becomes more and more complicated. Hitherto, a plastic package for encapsulating a semiconductor element using a cured resin has actively used due to the excellent productivity and the low cost. In the plastic package, a dual inline package (DIP) has been widely used but recently in addition to DIP, a surface mount package such as a plastic leaded chip carrier (PLCC), a quad flat package (QFP), a thin quad flat package (TQFP), a thin small outline package (TSOP), etc., have also been used. Furthermore, from the remarkable improvement of the recent input/output (I/O) electric characteristics and the ease of the packaging technology, a so-called one-surface encapsulation is being watched with keen interest and has been practically used in some semiconductor devices.

Figure 1:
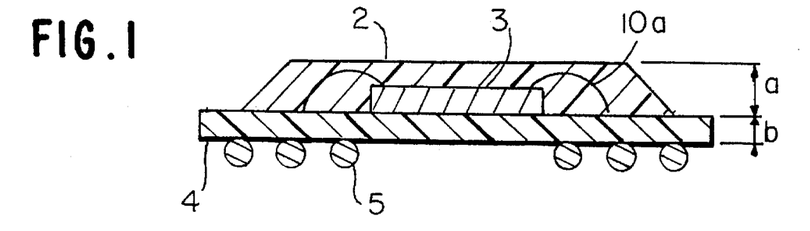
FIG. 1 is a structural view showing one embodiment of a one-surface encapsulated semiconductor device.

A practical embodiment of the one-surface encapsulation is a semiconductor device of a packaged state usually called BGA (ball grid array) as shown in FIG. 1 of the accompanying drawings. As shown in FIG. 1, in a semiconductor device 1, a semiconductor element 3 is loaded on a substrate 4 and the semiconductor element 3 is encapsulated with a cured resin 2. The encapsulation with the cured resin 2 is an encapsulation of only the side of the substrate 4 loading thereon the semiconductor element (one surface encapsulation). On the surface of the opposite side of the substrate to the encapsulated side are formed soldering terminals 5 each having a nearly spherical form.

Figure 2:
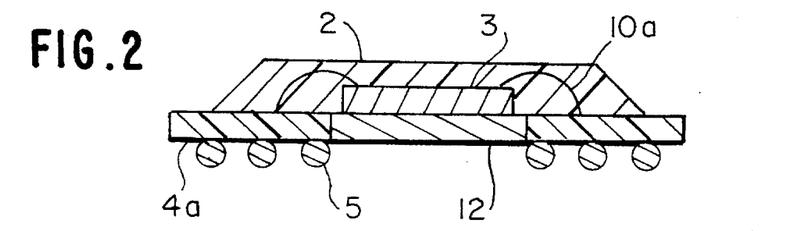
FIG. 2 is a structural view showing one embodiment in which a heat sink is formed in the one-surface encapsulated semiconductor device.

Another embodiment of the one-surface encapsulation is a semiconductor device having formed therein a heat sink 12 as shown in FIG. 2. The heat sink 12 is for radiating the heat generated from the semiconductor element 3. As shown in FIG. 2, the heat sink 12 is disposed at a definite portion of a substrate 4a and the semiconductor element 3 is loaded on the substrate 4a such that the semiconductor element 3 is located on the heat sink 12. The semiconductor element 3 is encapsulated with a cured resin 2 and the encapsulation is also a one-surface encapsulation for only the side of the substrate 4a on which the semiconductor element 3 is loaded as the case described above.

As described above, the semiconductor devices each formed by encapsulating a semiconductor element with a cured resin are excellent in the mass production and can be produced at low cost. Further, the semiconductor devices formed by the above-described one-surface encapsulation can give a high performance by increasing the degree of integration of semiconductor elements. However, plastic packaged semiconductor devices using a conventional cured resin are insufficient in the thermal cycle test (TCT) characteristics and a cracking resistance at immersing in a molten solder (hereinafter referred to as "cracking resistance") as compared with ceramic packaged semiconductor devices. Further, in the plastic packaged semiconductor devices, a problem arises that the semiconductor device is warped. That is, when producing the plastic packaged semiconductor device, after the encapsulation step with a cured resin, the encapsulated semiconductor is treated by various heat-treatment steps from room temperature to a reflow soldering step. In this case, since the cured resin, the substrate, etc., each differs in the properties such as the linear expansion coefficient, etc., the semiconductor device warps to the side having a low linear expansion coefficient. In the semiconductor device that such a warp occurred, since gaps form between parts such as the cured resin, the substrate, the semiconductor element, etc., water permeates into the inside of the semiconductor device through the gaps to greatly reduce the reliability of the device. In particular, the problem of the warp is serious in the one-surface encapsulated semiconductor device and the semiconductor device having the heat sink described above and even when the performance of the semiconductor device is improved, the fact is that the reliability is not improved.

SUMMARY OF THE INVENTION

The present invention has been made under the circumstances and the object of the present invention is to provide a semiconductor device which is excellent in the TCT characteristics and the cracking resistance and also excellent in the reliability without causing a warp.

To attain the above object, the semiconductor device of the present invention is a semiconductor device comprising a semiconductor element encapsulated with a cured resin, wherein the cured resin has at least two secondary differential peaks of linear thermal expansion by a thermomechanically analytical measurement, and the interval between the peaks is at least 20° C.

That is, a series of investigations have been made on cured resins for encapsulating semiconductor elements to overcome the problems of the TCT characteristics, the cracking resistance, and the warping problem as described above. As a result of further investigating the compositions and the properties of cured resins for encapsulation and producing for trial various cured resins, it has been found that when a semiconductor device is produced by encapsulating a semiconductor element using a cured resin which has at least two secondary differential peaks of linear thermal expansion by a thermomechanically analytical (TMA) measurement and wherein the interval between the peaks is at least 20° C., the semiconductor device satisfying the above object can be obtained. The present invention has been completed based on this finding. According to the present invention, semiconductor devices having an excellent reliability can be provided and, in particular, a high reliability can be imparted to the one-surface encapsulated semiconductor device capable of increasing the performance of the semiconductor device.

In the present invention, the TMA measurement is conducted according to JIS K7197. However, the test specimen shown in JIS K7197, item 3 is controlled in the following manner. In order to suppress a noise of a linear expansion coefficient to secondary differential peak due to moisture absorption of a cured resin, a cured resin (which is generally prepared by preliminarily molding under the standard curing conditions, i.e., 175° C., 70 kg/cm² (plunger pressure), 2 minutes, and then post-curing at 175° C. for 5 hours) is dried at 95° C. for 24 hours, preliminarily heated at 150° C. for 20 minutes, and then cooled to 25° C. The TMA measurement is conducted on the cured resin thus treated. Further, a test specimen having a size of 20 mm×3 mm×4 mm is used as the test specimen shown in JIS K7197, item 5.

Figure 6A:
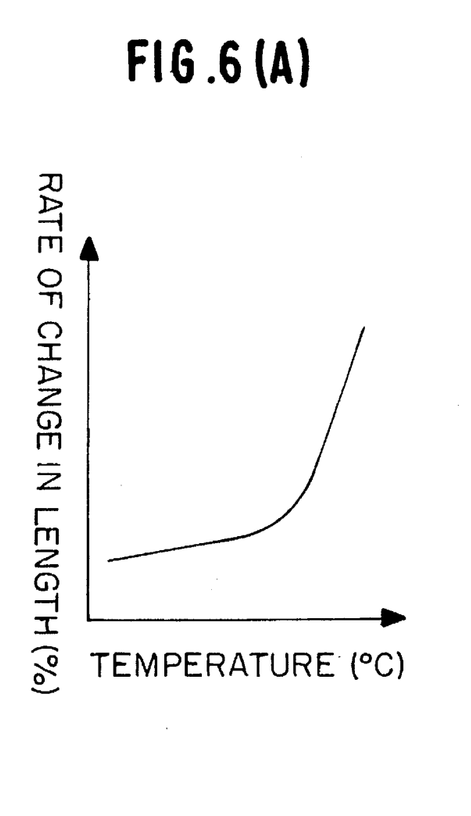
FIG. 6(A) is a graph showing one example of the result of the TMA measurement of a cured resin which is used in a conventional semiconductor device.
Figure 6B:
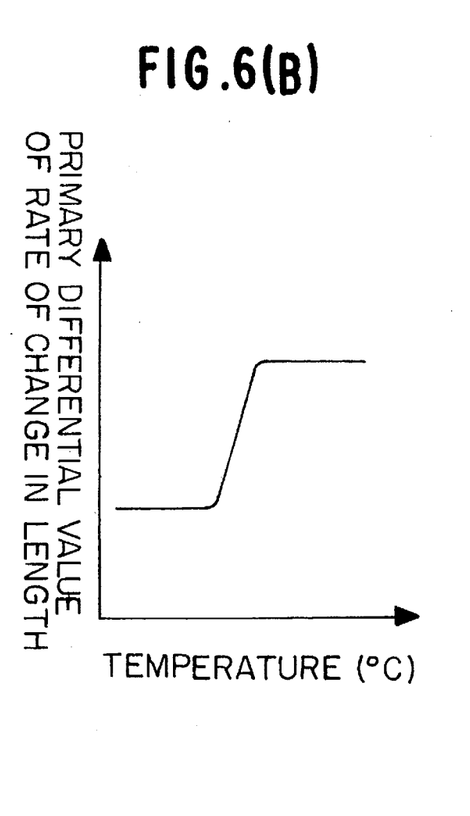
FIG. 6(B) is a graph obtained by primarily differentiating the measured result of the TMA measurement in FIG. 6(A)

Secondary differential peaks of linear thermal expansion by the TMA measurement used herein are as follows. When the TMA measurement is carried out on a cured resin, a curve showing the relationship between the ratio of change (%) in length of the cured resin and the measured temperature (° C.) is obtained as shown in FIG. 6(A). Usually, points (inflection points) corresponding to the changes of the state of the cured resin appear in this curve. If the curve showing the relationship between the ratio of change (%) in length of the cured resin and the measured temperature (° C.) is differentiated twice (secondary differentiation) with the measured temperature (° C.), the maximum values (peaks) are obtained at the measured temperature corresponding to the above-described inflection points as shown in FIG. 6(B), and the peaks are defined as the secondary differential peaks in the present invention.

DETAILED DESCRIPTION OF THE INVENTION

The present invention is explained in more detail below.

The semiconductor device of the present invention comprises a semiconductor element encapsulated with a specific cured resin.

There is no particular restriction on the specific cured resin if the cured resin has at least two secondary differential peaks by the TMA measurement and the interval between the peaks is at least 20° C. One example of such a cured resin is a cured product of a mixture of two kinds of resin compositions each having a glass transition point (Tg) of a different specific range. Example of the mixture of such resin compositions is a mixture of a resin composition (a) and a resin composition (b) described below:

(a) A resin composition the cured product of which has a glass transition point (Tg) of from 170° to 250° C.

(b) A resin composition the cured product of which has a glass transition point (Tg) of from 100° to 140° C.

Example of the resin composition (a) the cured product of which has a glass transition point (Tg) of from 170° to 250° C. is an epoxy resin-phenol resin curing-system epoxy resin composition wherein an epoxy resin is used as the main component and a phenol resin is used as a hardener. There is no particular restriction on the form of the resin composition (a) and the form thereof is usually a powder form or a tablet form obtained from the powder.

Examples of the epoxy resin (the main component) in the resin composition (a) are a cresol-novolak type epoxy resin, an epoxy resin represented by the following formula (1), and an epoxy resin represented by the following formula (2).

wherein Gly represents a glycidyl group.

wherein Gly represents a glycidyl group.

The epoxy resins represented by the formulae (1) and (2) generally have a softening point of from 40° to 120° C., an epoxy equivalent of from 120 to 250 g/eq., and a viscosity measured by an ICI Cone Plate Viscometer (manufactured by Cordix Co.) (hereinafter referred to as "ICI viscosity") at 150° C. of from 0.1 to 10 poise.

Besides the epoxy resins described above, examples of the epoxy resin in the resin composition (a) also include an epoxy resin represented by the following formula (3) and an epoxy resin represented by the formula (4).

wherein Gly represents a glycidyl group; n represents an integer of from 0 to 10; and $R_1$ and $R_2$ which may be the same or different each represents a hydrogen atom, a halogen atom, or an alkyl group having from 1 to 12 carbon atoms.

wherein Gly represents a glycidyl group.

The epoxy resins represented by the formulae (3) and (4) generally have a softening point of from 50° to 120° C. and an ICI viscosity at 150° C. of from 0.5 to 2.0 poise.

These epoxy resins may be used alone or as mixtures of two or more thereof. Of these epoxy resins, the epoxy resins represented by the formulae (3) and (4) are preferably used. This is because these epoxy resins each has a low viscosity and hence the resin composition obtained becomes to have a high flowability.

Examples of the phenol resin as the hardener for the resin composition (a) described above are a phenol-novolak resin, a cresol-novolak resin, a naphthol-noVolak resin, etc. These phenol resins usually have a softening point of from 40° to 120° C., a hydroxyl equivalent of from 70 to 280 g/eq., and an ICI viscosity at 150° C. of from 0.1 to 15 poise. Of these phenol resins, the phenol resins having a softening point of from 50° to 90° C., a hydroxyl equivalent of from 90 to 150 g/eq., and an ICI viscosity at 150° C. of from 0.1 to 1.0 poise are preferred. Example of such a preferred phenol resin is a phenol resin represented by the following formula (5).

wherein n represents an integer of from 0 to 10.

There is no particular restriction on the resin composition (b) the cured product of which has a glass transition point (Tg) of from 100 to 140° C., and the examples thereof are the same epoxy resin-phenol resin curing-system epoxy resin compositions as the resin composition (a) described above.

Examples of the epoxy resin (the main component) in the resin composition (b) are bifunctional epoxy resins such as a bisphenol A-type epoxy resin, etc. These epoxy resins generally have a softening point of from 20° to 160° C., an epoxy equivalent of from 90 to 220 g/eq., and an ICI viscosity at 150° C. of from 0.01 to 10 poise. Of these epoxy resins, the epoxy resins having a softening point of from 50° to 150° C., an epoxy equivalent of from 120 to 210 g/eq., and an ICI viscosity at 150° C. of from 0.01 to 0.2 poise are preferred.

Examples of the preferred epoxy resin are the epoxy resins represented by the following formulae (6) to (8).

wherein $R_1$, $R_2$, $R_3$, $R_4$, $R_5$, and $R_6$ which may the same or different each represents a hydrogen atom, a halogen atom, an alkyl group having from 1 to 12 carbon atoms, or a 2,3-epoxypropyl group, and at least two of $R_1$ to $R_6$ are a 2,3-epoxypropoxy group.

wherein $R_1$, $R_2$, $R_3$, and $R_4$ which may be the same or different each represents a hydrogen atom or an alkyl group having from 1 to 12 carbon atoms, and Gly represents a glycidyl group.

wherein $R_1$, $R_2$, $R_3$, and $R_4$ which may be the same or different each represents a hydrogen atom or an alkyl group having from 1 to 12 carbon atoms, and Gly represents a glycidyl group.

These epoxy resins may be used alone or as mixtures of two or more thereof.

Examples of the phenol resin which is the hardener for the resin composition (b) are phenol resins represented by the following formulae (9) to (11).

wherein R which may be the same or different each represents a hydrogen atom, a halogen atom, or an alkyl group having from 1 to 12 carbon atoms, and n represents an integer of from 0 to 12.

wherein $A_2$ represents and

$A_1$ represents wherein R represents a hydrogen atom, a halogen atom, or an alkyl group having from 1 to 12 carbon atoms; and n represents an integer of from 1 to 10.

wherein A represents or $R_1$ and $R_2$ which may be the same or different each represents a hydrogen atom, a halogen atom, or an alkyl group having from 1 to 12 carbon atoms; n represents an integer of from 1 to 9; m represents an integer of from 1 to 9; and n+m is an integer of from 2 to 10.

These phenol resins usually have a softening point of from 40° to 120° C., a hydroxyl equivalent of from 70 to 340 g/eq., and an ICI viscosity at 150° C. of from 0.1 to 15 poise. Of these phenol resins, the phenol resins having a softening point of from 50° to 90° C., a hydroxyl equivalent of from 140 to 280 g/eq, and an ICI viscosity at 150° C. of from 0.1 to 2.0 poise are preferred.

In each of the resin compositions (a) and (b) described above, the compounding ratio of the epoxy resin (the main component) and the phenol resin (the hardener) is preferably such that the hydroxyl group in the phenol resin per one equivalent of the epoxy group in the epoxy resin is from 0.8 to 1.2 equivalents. More preferably, the hydroxyl group in the phenol resin per one equivalent of the epoxy group in the epoxy group is from 0.9 to 1.1 equivalents.

If required and necessary, the resin compositions (a) and (b) may be compounded with an inorganic filler and various additives in addition to the main component (the epoxy resin) and the hardener (the phenol resin).

There is no particular restriction on the inorganic filler, and inorganic fillers generally used, such as a quartz glass powder, talc, a silica powder, calcium carbonate, or a carbon black can be used. Of these fillers, a silica powder is preferably used. The compounding ratio of the inorganic filler is appropriately determined according to the kind, etc. When the silica powder is used, the compounding ratio of the silica powder is preferably from 50 to 99% by weight (hereinafter abbreviated as "%"), and more preferably from 75 to 95%, based on the total weight of the respective resin composition.

On the other hand, one of the additives is a stressreducing agent. Using the stress-reducing agent can effectively prevent the occurrence of the warp of the semiconductor device obtained. Examples of the stress-reducing agent are a silicone rubber, an olefin rubber, etc. The preferred stress-reducing agents are the silicone compounds represented by the following formulae (12) and (13).

wherein R represents a methyl group; $R_1$ represents $-(CH_2)_y$ wherein y represents an integer of from 1 to 3; A represents an amino group, a 2,3-epoxypropoxy group, a carboxyl group, a hydroxyl group, or a cyclohexene oxide group; B represents $-O-(C_3H_6O)_z-CH_3$ wherein z represents an integer of from 1 to 5; n, m, and l each represents an integer of from 0 to 300; and n+m +l is an integer of from 1 to 300.

wherein R represents a methyl group; $R_1$ represents $-(CH_2)_y$ wherein y represents an integer of from 1 to 3; A represents an amino group, a 2,3-epoxypropoxy group, a carboxyl group, a hydroxyl group, or a cyclohexene oxide group; and n represents an integer of from 0 to 300.

The compounding ratio of the silicone compound is preferably 30% or less, and more preferably from 0.3 to 15%, based on the total weight of the respective resin composition.

Example of other additive which can be used is a cure accelerator. There is no particular restriction on the cure accelerator, and the examples thereof are tertiary amines, quaternary ammonium salts, imidazoles, boron compounds, and phosphorus compounds. Those can be used alone or as mixtures of them. Of these compounds, phosphorus compounds are preferable. Examples of the phosphorus compounds include triphenyl phosphine, tetraphenyl phosphine-tetraphenyl borate, and the like.

Further examples of other additives which can be used are a flame retardant such as antimony trioxide, phosphorus compounds, etc.; a pigment such as carbon black, titanium oxide, etc.; a mold releasing agent such as paraffin, aliphatic esters, etc.; and a coupling agent such as silane coupling agents, etc.

The resin composition (a) and the resin composition (b) each can be used as a mixture thereof. The determination of the interval of the peaks in each of the resin compositions (a) and (b) is explained later.

The mixture of the resin compositions (a) and (b) is prepared, for example, as follows.

For each of the resin compositions (a) and (b), the main component (epoxy resin), the hardener (phenol resin), and, if required and necessary, the inorganic filler, the stress-reducing agent, the flame retardant, the pigment, the mold releasing agent, and the coupling agent are compounded in the respective predetermined amount. Each mixture is melt-kneaded in a heated state using a kneader such as a mixing roll, and the kneaded mixture is cooled to room temperature and ground by a conventional means to obtain each of the resin compositions (a) and (b). In this case, it is preferred that these resin compositions (a) and (b) are in a B stage (semi-cured state). Thereafter, a series of steps of compounding the ground products of these resin compositions (a) and (b) at a definite ratio, mixing them, and, if necessary, tabletizing the resulting mixture is employed to obtain the desired mixture of the resin compositions (a) and (b). The compounding ratio (weight ratio) of the resin composition (a) and the resin composition (b) is usually (a)/(b)=1/4 to 4/1, and preferably (a)/(b)=1/3 to 3/1. In the mixture of the resin compositions (a) and (b), the contents of the organic components are preferably from 5 to 25%, and more preferably from 5 to 15%. If the contents are less than 5%, the flowability of the resin compositions obtained is poor, and as a result, there is a possibility that a poor molding occurs in the encapsulation of a semiconductor element, while if the contents are over 25%, there is a possibility that a warp occurs in the cured resin obtained.

The organic components described above include the epoxy resin (the main component), the hardener, the catalyst (cure accelerator), the mold releasing agent, and the coupling agent.

A method other than the above-described method is a method of preparing the mixture of the resin compositions (a) and (b) as the mixture thereof from the first without preparing each of the resin compositions. That is, the main components (the epoxy resins), the hardeners (the phenol resins) and, if required and necessary, the inorganic filler, the stress-reducing agent, the flame retardant, the pigment, the mold releasing agent, and the coupling agent are compounded such that the mixing ratios of them are the final definite mixing ratio of the resin compositions (a) and (b). A series of steps of melt-kneading the mixture in a heated state using an kneading machine such as a mixing roll, cooling the kneaded mixture to room temperature, grinding the mixture by a conventional means, and, if necessary, tabletizing the ground mixture is then employed, and the desired mixture of the resin compositions (a) and (b) can be obtained. In this case, the contents of the organic resin components are also preferably from 5 to 25%, and more preferably from 5 to 15%.

There is also no particular restriction on the method of encapsulating a semiconductor element by curing the mixture of the resin compositions (a) and (b), and the method can be carried out by a conventional molding method such as an ordinary transfer molding, etc.

Thus, the semiconductor device of the present invention can be prepared. In the present invention, curing the resin compositions is usually carried out by heating, but the curing is not limited by heating and can include curing by, for example, irradiation with ultraviolet rays.

The semiconductor device of the present invention uses preferably a fiber-reinforced substrate (a fiber-reinforced polyimide resin plate, a high Tg epoxy resin laminate, etc.), and more preferably a bismaleimidotriazine (BT)/glass cloth substrate, as the substrate when loading a semiconductor element on the substrate.

The semiconductor device of the present invention is not limited to the one-surface encapsulated BGA-form semiconductor device shown in FIG. 1. Other embodiment of the semiconductor device of the present invention is a semiconductor device that a heat sink 12 is disposed at a definite position of a substrate 4a, a semiconductor element 3 is loaded on the heat seal 12 of the substrate 3, and one surface (the semiconductor element side) is encapsulated, as shown in FIG. 2.

In the one-surface encapsulated semiconductor devices as described above, the sizes are as follows.

The sizes are explained by taking the case of the BGA-form semiconductor device of FIG. 1. When a fiber-reinforced substrate such as the BT/glass cloth substrate is used as the substrate 4, the area of the one surface is preferably from 100 to 10,000 mm$^2$, and more preferably from 625 to 3,600 mm$^2$. When the form of the substrate 4 is a rectangle, the form is preferably a square. When the form of the substrate is an oblong form, the length of the long side is from about 1 to 3 times the short side length.

The thickness b of the substrate 4 is preferably from 0.05 to 3 mm, and more preferably from 0.1 to 1.0 mm. When the form of the occupied surface of the cured resin 2 (the bottom surface of the cured resin 2 including the bottom surface of the semiconductor element 3) is a rectangle, the form is preferably a square, and the area of the occupied surface is preferably from 100 to 10,000 mm$^2$, and more preferably from 625 to 3,600 mm$^2$. The thickness a of the cured resin 2 is preferably from 0.2 to 3 mm, and more preferably from 0.2 to 1.4 mm.

By selecting the sizes, etc., of the substrate and the cured resin to be the desired suitable conditions, the occurrence of the warp of the cured resin can be more effectively prevented.

Figure 8:
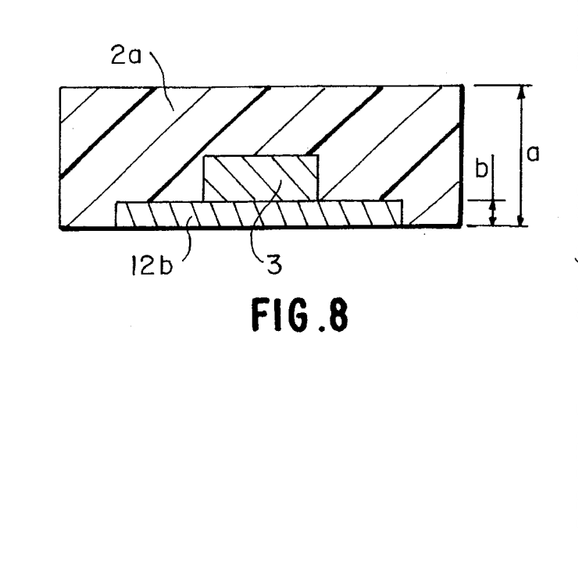
FIG. 8 is a structural view showing one embodiment of a semiconductor device that a semiconductor element is loaded on the heat sink thereof.

Other embodiment of the one-surface encapsulated-type semiconductor device of the present invention is a semiconductor device wherein a semiconductor element 3 is directly loaded on a thin plate-form heat sink 12b and the semiconductor element 3 is encapsulated with a cured resin 2 as shown in FIG. 8. As shown in FIG. 8, the whole members (the semiconductor element 3 and the thin plate-form heat sink 12b) except for the bottom surface of the heat sink 12b are encapsulated with the cured resin 2a.

In such a semiconductor device, the thin plate-form heat sink 12b is a metal plate such as copper, aluminum, etc. When the form of the metal plate is a rectangle, the form is preferably a square. The area of one surface of the thin plate-form heat sink 12b is preferably from 100 to 10,000 mm$^2$. The thickness b of the thin plate-form heat sink 12b is preferably from 0.05 to 3 mm. When the form of the occupied surface (the bottom surface of the cured resin 2a including the bottom surface of the heat sink 12b) is a rectangle, the form is preferably a square and the area of the occupied surface is preferably from 100 to 14,400 mm$^2$. When the form is an oblong form, the length of the long side is from about 1 to 3 times the short side length. The thickness a of the cured resin 2a is preferably from 0.25 to 4 mm, and more preferably from 0.8 to 3 mm.

Figure 3:
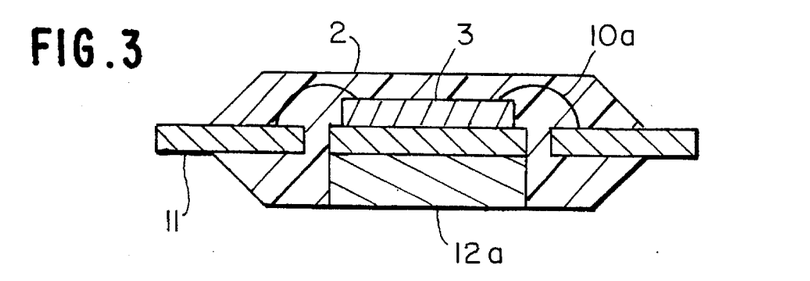
FIG. 3 is a structural view showing one embodiment of a one-surface encapsulated semiconductor device using leading frames and a heat sink.

Still another embodiment of the semiconductor device of the present invention is a semiconductor device that a semiconductor element 3 is loaded on a lead frame 11, a heat sink 12a is disposed almost under the lead frame at the portion having loaded thereon the semiconductor element 3 such that the heat sink 12a is in contact with the lead frame 11, and they are encapsulated with a cured resin 2 except for the extended portions of the lead frame 11 as shown in FIG. 3. In the present invention, the encapsulated form as shown in FIG. 3 is also included in the one-surface encapsulated form. The reason therefor is that since the bottom surface of the heat sink 12a is exposed without being encapsulated, such a form is not said to be a both-surface encapsulated form. In FIG. 3, numeral 10a is a leading wire for connecting the semiconductor element 3 and each of the lead frames 11.

Figure 4:
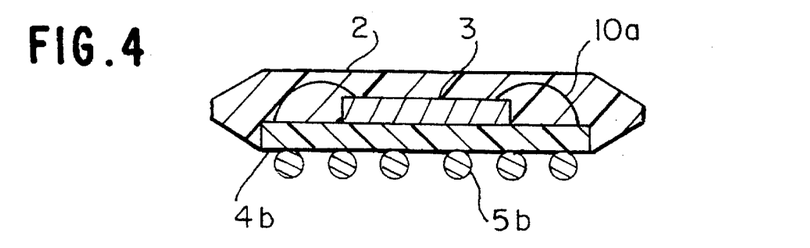
FIG. 4 is a structural view showing another embodiment of one-surface encapsulated semiconductor device.
Figure 5:
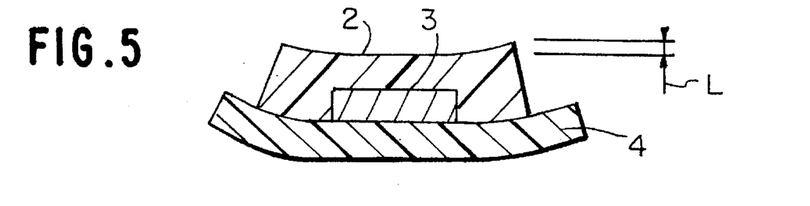
FIG. 5 is a view explaining the state of measuring the warp of a semiconductor device.

Further embodiment of the semiconductor device of the present invention is a semiconductor device having the form shown in FIG. 4, wherein the numerals 2, 3, 4, and 5 have the same meaning as in FIG. 1.

In FIG. 1, 2 and 4, input and output signals to the semiconductor elements 3 is transferred through the soldering balls (terminals) 5, the substrate 4 and the leading wire 10a.

The input signal introduced from the balls, generally soldering balls 5, reaches wire bond pads through a circuit and a through-hole formed in the substrate 4. The input signal then reaches from the wire bond pads to the semiconductor element 3 through a leading wire 10a, generally a metal wire.

Regarding the output signal from the semiconductor element, informations are supplied to the outside by the flow entirely reverse to the above route.

The cured resin used in the present invention has at least two secondary differential peaks of linear thermal expansion by the TMA measurement, wherein the interval between these peaks is at least 20° C.

Figure 6C:
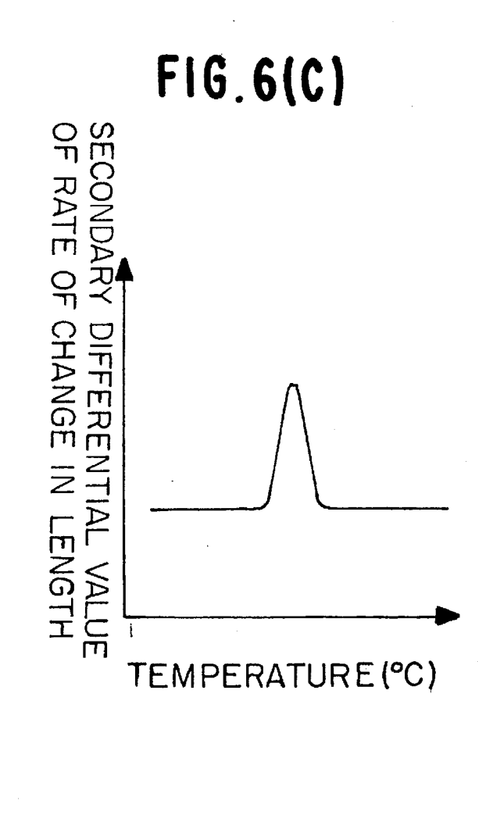
FIG. 6(C) is a graph obtained by secondarily differentiating the measurement result of the TMA measurement in FIG. 6(A)

When a conventional cured resin is measured by the TMA measurement, the inflection point of the state in the TMA curve is single as shown in FIG. 6(A). When the TMA curve is primarily differentiated with a temperature, a stepwise curve as shown in FIG. 6(B) is obtained, and when the curve is further secondarily differentiated with a temperature, the portion corresponding to the above inflection point of the state appears as one peak as shown in FIG. 6(C).

Figure 7A:
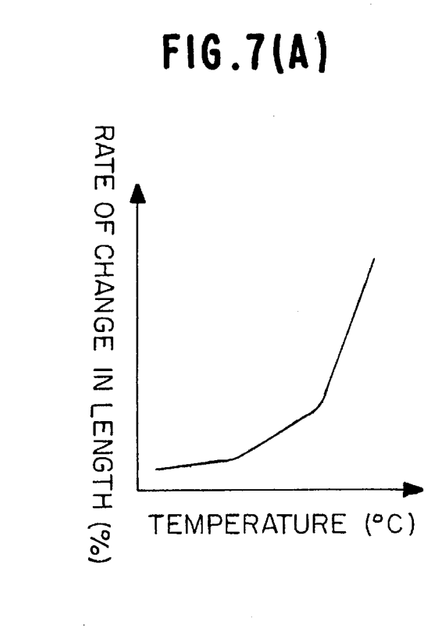
FIG. 7(A) is a graph showing one example of the result of the TMA measurement of the cured resin which is used in the semiconductor device of the present invention.

On the other hand, in the cured resin used in the present invention, the inflection points of the state in the TMA curve are two as shown in FIG. 7(A). When the curve is secondarily differentiated with a temperature, two peaks are obtained as shown in FIG. 7(B), and the interval D between the two peaks is at least 20° C.

Figure 7B:
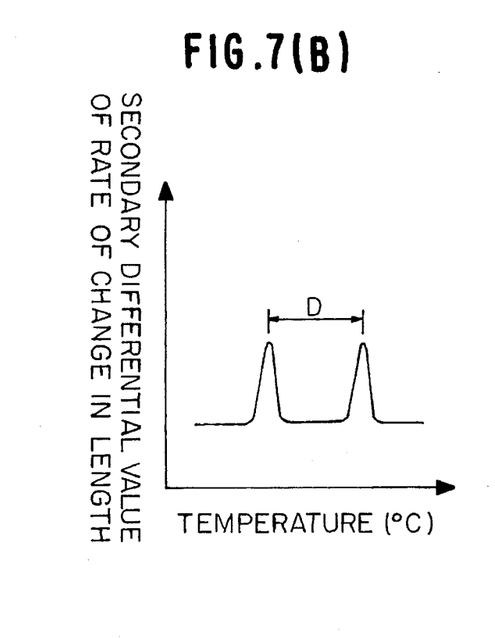
FIG. 7(B) is a graph obtained by secondarily differentiating the measured result of the TMA measurement in FIG. 7(A)

FIG. 7 shows the embodiment that the secondary peaks are two, but the cured resins in the present invention are not limited to the embodiment, and the cured resins in the present invention can also have three secondary differential peaks, four secondary differential peaks, or more secondary differential peaks. In this case, (i.e., having three or more secondary differential peaks), the interval between two peaks which are located at both terminals is at least 20° C. In the preferred embodiment thereof, at least one interval between the adjacent peaks is at least 20° C. In any embodiment, the peak interval between the terminal peaks is generally at least 20° C., preferably from 30° to 150° C., and more preferably from 30 to 100° C.

As described above, in the semiconductor device comprising a semiconductor element encapsulated with the cured resin having the specific thermal properties, the occurrence of a warp by heating is prevented, and the TCT characteristics and the cracking resistance at immersing in a molten solder are excellent. The reason is not clearly explained, but based on the knowledges obtained from a series of investigations on semiconductor devices, the present inventors conjecture as follows.

That is, in a cured resin, a stress relaxation ability is appeared in the glass transition point (Tg) region thereof, and by expanding the range of the glass transition point region of a cured resin, the stress relaxation ability is appeared over a wide temperature range in the cured resin. Accordingly, it is conjectured that in the semiconductor device using the cured resin having such a property, the warp of the cured resin by heating, etc., does not occur.

As described above, in the semiconductor device of the present invention, the semiconductor element is encapsulated using the cured resin having at least two secondary differential peaks of linear thermal expansion by the TMA measurement, the interval of these peaks being at least 20° C. In the semiconductor device using the specific cured resin as described above, the TCT characteristics and the cracking resistance are excellent and the warp does not occur in the region from normal temperature to a reflow soldering temperature, whereby the reliability of the semiconductor device becomes excellent. In particular, in a one-surface encapsulated semiconductor device and a semiconductor device equipped with a heat sink, wherein the problem of warp is severe, the occurrence of the warp can be effectively prevented. Thus, a high reliability can be imparted to a high-performance semiconductor device having a very high degree of integration.

The present invention is described in more detail by referring to the following Examples and Comparative Examples.

The following epoxy resins A to F, phenol resins G to J, and silicone compound K were prepared.

[Epoxy Resin A]

(14)

Epoxy equivalent: 159 g/eq.
Gly: Glycidyl group
Softening point: 60° C.
n=0 to 3

[Epoxy Resin B]

(15)

Epoxy equivalent: 101 g/eq.
Softening point: 110° C.
Gly: Glycidyl group

[Epoxy Resin C]

(16)

Epoxy equivalent: 182 g/eq.
Softening point: 138° C.
Gly: Glycidyl group

[Epoxy Resin D]

(17)

Epoxy equivalent: 196 g/eq.

Softening point: 138° C.

Gly: Glycidyl group

[Epoxy Resin E]

(18)

Epoxy equivalent: 190 g/eq.

Softening point: 79° C.

[Phenol Resin J]

(23)

Gly: Glycidyl group

[Epoxy Resin F]

(19)

Epoxy equivalent: 195 g/eq.

Softening point: 85° C.

Gly: Glycidyl group n=0 to 3

[Phenol Resin G]

(20)

Hydroxyl equivalent: 107 g/eq.

Softening point: 80° C.

n=0 to 3

[Phenol Resin H]

(21)

Hydroxyl equivalent: 163 g/eq.

Softening point: 75° C.

n+m=1 to 3 (m≧1)

[Phenol Resin I]

(22)

Hydroxyl equivalent: 167 g/eq.

Softening point: 91° C.

n=0 to 3

R which may be the same or different each represents a hydrogen atom, a halogen atom or an alkyl group having from 1 to 12 carbon atoms.

Hydroxyl equivalent: 172 g/eq.

Softening point: 70° C.

n=0 to 3

[Silicone Compound K]

(24)

Epoxy equivalent: 6500 g/eq.

n=3 to 4, m=70 to 120, l=3 to 7 z=5 to 25

EXAMPLES 1 TO 39, AND COMPARATIVE EXAMPLES 1 TO 4

Each of the raw materials described above and other raw materials (additives) shown in Table 1 to Table 7 were compounded at the ratios shown in each Table, each compounded mixture was melt-kneaded for 3 minutes by a mixing roll machine (temperature 100° C.), and after solidifying by cooling, the solidified mixture was ground to obtain each powdery epoxy resin composition. In Examples 33 to 38, epoxy resin compositions a to h were prepared at the compounding ratios shown in Table 6, and by following the same procedures as other examples except that the components were compounded at the ratios (weight ratios) shown in Table 7, desired powdery epoxy resin compositions were obtained. Glass transition points (Tg) of the epoxy resin compositions composed of the combinations of the epoxy resins A to F described above and the phenol resins G to J described above are shown in Table 8 below.

The amounts shown in the Tables are all parts by weight.

TABLE 1

| | EXAMPLE | | | | | | | |
|---|---|---|---|---|---|---|---|---|
| | 1 | 2 | 3 | 4 | 5 | 6 | 7 | 8 |
| Epoxy Resin | | | | | | | | |
| A | 75 | 75 | 75 | 50 | 50 | 50 | 25 | 25 |
| B | — | — | — | — | — | — | — | — |
| C | 25 | 25 | 25 | 50 | 50 | 50 | 75 | 75 |
| D | — | — | — | — | — | — | — | — |
| E | — | — | — | — | — | — | — | — |
| F | — | — | — | — | — | — | — | — |
| Phenol Resin | | | | | | | | |
| G | 46 | 46 | 46 | 31 | 31 | 31 | 15 | 15 |
| H | 22 | 22 | 22 | 45 | 45 | 45 | 67 | 67 |
| I | — | — | — | — | — | — | — | — |
| J | — | — | — | — | — | — | — | — |
| Silicone Compound K | — | 8 | 17 | — | 9 | 18 | — | 9 |
| Cure Accelerator* | 2 | 2 | 2 | 3 | 3 | 3 | 3 | 3 |
| Carnauba Wax | 5 | 5 | 5 | 5 | 5 | 5 | 5 | 5 |
| Silica Powder | 1,424 | 1,492 | 1,560 | 1,649 | 1,728 | 1,807 | 1,926 | 2,018 |

*Triphenylphosphine

TABLE 2

| | EXAMPLE | | | | | | | |
|---|---|---|---|---|---|---|---|---|
| | 9 | 10 | 11 | 12 | 13 | 14 | 15 | 16 |
| Epoxy resin | | | | | | | | |
| A | 25 | 50 | 50 | 50 | 50 | 50 | 50 | 50 |
| B | — | — | — | — | — | — | — | — |
| C | 75 | — | — | — | — | 25 | 25 | 25 |
| D | — | 50 | 50 | — | — | 25 | 25 | — |
| E | — | — | — | 50 | 50 | — | — | 25 |
| F | — | — | — | — | — | — | — | — |
| Phenol Resin | | | | | | | | |
| G | 15 | 31 | 31 | 31 | 31 | 31 | 31 | 31 |
| H | 67 | 42 | 42 | 43 | 43 | 43 | 43 | 44 |
| I | — | — | — | — | — | — | — | — |
| J | — | — | — | — | — | — | — | — |
| Silicone Compound K | 18 | — | 9 | — | 9 | — | 9 | — |
| Cure Accelerator* | 3 | 3 | 3 | 3 | 3 | 3 | 3 | 3 |
| Carnauba Wax | 5 | 5 | 5 | 5 | 5 | 5 | 5 | 5 |
| Silica Powder | 2,110 | 1,621 | 1,699 | 1,631 | 1,709 | 1,635 | 1,710 | 1,642 |

*Triphenylphosphine

TABLE 3

| | EXAMPLE | | | | | | | |
|---|---|---|---|---|---|---|---|---|
| | 17 | 18 | 19 | 20 | 21 | 22 | 23 | 24 |
| Epoxy Resin | | | | | | | | |
| A | 50 | 50 | 50 | 50 | 50 | 50 | 50 | 50 |
| B | — | — | — | — | — | — | — | — |
| C | 25 | — | — | 25 | 25 | 50 | 50 | — |
| D | — | 25 | 25 | 10 | 10 | — | — | 50 |
| E | 25 | 25 | 25 | 5 | 5 | — | — | — |
| F | — | — | — | — | — | — | — | — |
| Phenol Resin | | | | | | | | |
| G | 31 | 31 | 31 | 31 | 31 | 31 | 31 | 31 |
| H | 44 | 42 | 42 | 43 | 43 | — | — | — |
| I | — | — | — | — | — | 46 | — | 46 |
| J | — | — | — | — | — | — | 47 | — |
| Silicone Compound K | 9 | — | 9 | — | 8 | 9 | 9 | 9 |
| Cure Accelerator | 3 | 3 | 3 | 3 | 3 | 3 | 3 | 3 |
| Carnauba Wax | 5 | 5 | 5 | 5 | 5 | 5 | 5 | 5 |
| Silica Powder | 1,721 | 1,628 | 1,706 | 1,544 | 1,618 | 1,744 | 1,756 | 1,745 |

*Triphenylphosphine

TABLE 4

| | EXAMPLE | | | | | | | | |
|---|---|---|---|---|---|---|---|---|---|
| | 25 | 26 | 27 | 28 | 29 | 30 | 31 | 32 | 33 |
| Epoxy Resin | | | | | | | | | |
| A | 50 | 50 | 50 | — | — | — | — | — | — |
| B | — | — | — | 75 | 50 | 25 | 50 | 50 | — |
| C | — | — | — | 25 | 50 | 75 | — | — | 50 |
| D | 50 | — | — | — | — | — | 50 | — | 50 |
| E | — | — | — | — | — | — | — | 50 | — |
| F | — | — | — | — | — | — | — | — | — |
| Phenol Resin | | | | | | | | | |
| G | 31 | 31 | 31 | 77 | 51 | 26 | 51 | 51 | — |
| H | — | — | — | 22 | 45 | 67 | 42 | 43 | — |
| I | — | 46 | — | — | — | — | — | — | 45 |
| J | 47 | — | 47 | — | — | — | — | — | 51 |
| Silicone Compound K | 9 | 9 | 10 | 10 | 10 | 10 | 10 | 10 | 10 |
| Cure Accelerator* | 3 | 3 | 3 | 3 | 3 | 3 | 3 | 3 | 3 |
| Carnauba Wax | 5 | 5 | 5 | 5 | 5 | 5 | 5 | 5 | 5 |
| Silica Powder | 1,754 | 1,746 | 1,755 | 2,200 | 2,165 | 2,129 | 2,128 | 2,139 | 2,163 |

*Triphenylphosphine

TABLE 5

| | Comparative Example | | | |
|---|---|---|---|---|
| | 1 | 2 | 3 | 4 |
| Epoxy Resin | | | | |
| A | 100 | — | — | — |
| B | — | — | — | — |
| C | — | 100 | — | — |
| D | — | — | — | — |
| E | — | — | — | — |
| F | — | — | 100 | 100 |
| Phenol Resin | | | | |
| G | 62 | — | 53 | 53 |
| H | — | 90 | — | — |
| I | — | — | — | — |
| J | — | — | — | — |
| Silicone Compound K | 16 | 0 | 0 | 16 |
| Cure Accelerator* | 3 | 3 | 3 | 3 |
| Carnauba Wax | 5 | 5 | 5 | 5 |
| Silica Powder | 1,141 | 1,778 | 645 | 531 |

*Triphenylphosphine

TABLE 6

| | Epoxy Resin Composition | | | | | | | |
|---|---|---|---|---|---|---|---|---|
| | a | b | c | d | e | f | g | h |
| Epoxy Resin A | 100 | 100 | 100 | 100 | — | — | — | — |
| Epoxy Resin C | — | — | — | — | 100 | 100 | 100 | 100 |
| Phenol Resin G | 62 | 62 | 62 | 62 | — | — | — | — |
| Phenol Resin H | — | — | — | — | 90 | 90 | 90 | 90 |
| Silicone Compound K | 17 | 17 | 17 | 17 | — | — | — | — |
| Cure Accelerator* | 2 | 2 | 2 | 3 | 3 | 3 | 3 | 3 |
| Carnauba Wax | 5 | 5 | 5 | 5 | 5 | 5 | 5 | 5 |
| Silica Powder | 1,142 | 1,247 | 1,365 | 1,510 | 1,775 | 1,998 | 2,276 | 2,629 |

*Triphenylphosphine

TABLE 7

| | Example | | | | | |
|---|---|---|---|---|---|---|
| | 33 | 34 | 35 | 36 | 37 | 38 |
| Epoxy Resin Composition | | | | | | |
| a | — | — | — | — | 1 | — |
| b | — | 1 | — | — | — | — |
| c | 1 | — | — | — | — | — |
| d | — | — | 1 | 1 | — | 1 |
| e | — | — | — | — | — | 1 |
| f | — | — | 1 | — | — | — |
| g | 1 | — | — | — | — | — |
| h | — | 1 | — | 1 | 1 | — |

TABLE 8

| | (Tg, °C.) | | | | | |
|---|---|---|---|---|---|---|
| | Epoxy Resin | | | | | |
| Phenol Resin | A | B | C | D | E | F |
| G | 180 | 190 | 150 | 140 | 120 | 160 |
| H | 150 | 160 | 120 | 110 | 80 | 150 |
| I | 170 | 180 | 130 | 120 | 85 | 140 |
| J | 180 | 190 | 140 | 130 | 90 | 160 |

A semiconductor element was subjected to transfer molding at 175° C. for 2 minutes using each of the epoxy resin compositions shown in Examples 1 to 39 and Comparative Examples to 4 described above, followed by post-curing at 175° C. for 5 hours, and each heat sink-equipped one-surface encapsulated semiconductor device as shown in FIG. 2 was obtained.

The conditions of the semiconductor device thus obtained are as follows.

Cured Resin Size: 40 mm×40 mm×2 mm

Semiconductor Element Size: 12 mm×12 mm×0.4 mm

Substrate Size: 48 mm×48 mm×0.8 mm

Substrate Material: Bismaleimidotriazine/glass cloth substrate (made by Mitsubishi Gas Chemical Company, Inc.)

On each of the semiconductor devices as the products in Examples 1 to 39 and the products in Comparative Examples 1 to 4 thus obtained, the TMA measurement of the cured resin and the measurement of the warp of each semiconductor device were carried out. The results obtained are shown in Tables 9 to 20 below.

The TMA measurement and the measurement of the warp described above were carried out by the following methods.

TMA Measurement

Using a TMA measurement apparatus (MJ-800GM, trade name, manufactured by Rigaku Sha K.K.), after drying the cured resin (4 mm×3 mm×20 mm) treated by the specific curing conditions described above at 95° C. for 24 hours, the elongation of the cured resin was measured in the temperature range of from 30° to 250° C. In the measurement condition, the temperature raising speed was 2° C./minute.

Measurement of Warp of Semiconductor Device

The warp of each semiconductor device was measured in the range of from room temperature of the reflow temperature (i.e., 25° C. to 260° C.). In the measurement of the warp, the warped amount L shown in FIG. 4 was measured using a microdepth meter.

TABLE 9

| | Example | | | | | | | |
|---|---|---|---|---|---|---|---|---|
| | 1 | 2 | 3 | 4 | 5 | 6 | 7 | 8 |
| 1st Peak (Tg) | 120 | 120 | 130 | 120 | 130 | 130 | 110 | 120 |
| 2nd Peak (Tg) | 160 | 170 | 180 | 150 | 160 | 170 | 140 | 150 |
| Temperature Difference (°C.) | 40 | 50 | 50 | 30 | 30 | 40 | 30 | 30 |

TABLE 10

| | Example | | | | | | | |
|---|---|---|---|---|---|---|---|---|
| | 9 | 10 | 11 | 12 | 13 | 14 | 15 | 16 |
| 1st Peak (Tg) | 120 | 100 | 110 | 130 | 130 | 100 | 120 | 120 |
| 2nd Peak (Tg) | 150 | 170 | 180 | 180 | 190 | 170 | 160 | 190 |
| Temperature Difference (°C.) | 30 | 70 | 60 | 50 | 60 | 70 | 40 | 70 |

TABLE 11

| | Example | | | | | | | |
|---|---|---|---|---|---|---|---|---|
| | 17 | 18 | 19 | 20 | 21 | 22 | 23 | 24 |
| 1st Peak (Tg) | 110 | 100 | 120 | 120 | 120 | 140 | 130 | 120 |
| 2nd Peak (Tg) | 180 | 190 | 180 | 190 | 180 | 180 | 180 | 190 |
| Temperature Difference (°C.) | 70 | 90 | 60 | 70 | 60 | 40 | 50 | 70 |

TABLE 12

| | Example | | | | | | | |
|---|---|---|---|---|---|---|---|---|
| | 25 | 26 | 27 | 28 | 29 | 30 | 31 | 32 |
| 1st Peak (Tg) | 130 | 120 | 130 | 150 | 170 | 120 | 120 | 110 |
| 2nd Peak (Tg) | 180 | 190 | 200 | 210 | 220 | 180 | 190 | 180 |
| Temperature Difference (°C.) | 50 | 70 | 70 | 60 | 50 | 60 | 70 | 70 |

TABLE 13

| | Example | | | | | | |
|---|---|---|---|---|---|---|---|
| | 33 | 34 | 35 | 36 | 37 | 38 | 39 |
| 1st Peak (Tg) | 120 | 130 | 120 | 110 | 130 | 100 | 120 |
| 2nd Peak (Tg) | 190 | 180 | 190 | 180 | 200 | 200 | 140 |
| Temperature Difference (°C.) | 70 | 50 | 70 | 70 | 70 | 100 | 20 |

TABLE 14

| | Comparative Example | | | |
|---|---|---|---|---|
| | 1 | 2 | 3 | 4 |
| 1st Peak (Tg) | 180 | 90 | 170 | 180 |
| 2nd Peak (Tg) | — | — | — | — |
| Temperature Difference (°C.) | — | — | — | — |

TABLE 15

| | Example | | | | | | | |
|---|---|---|---|---|---|---|---|---|
| | 1 | 2 | 3 | 4 | 5 | 6 | 7 | 8 |
| Depth of Warp (μm) | | | | | | | | |
| Room Temp. | 60 | 50 | 40 | 40 | 40 | 30 | 40 | 40 |

TABLE 15-continued

| | Example | | | | | | | |
|---|---|---|---|---|---|---|---|---|
| | 1 | 2 | 3 | 4 | 5 | 6 | 7 | 8 |
| 100° C. | 100 | 100 | 100 | 90 | 80 | 70 | 80 | 80 |
| 150° C. | 50 | 50 | 50 | 60 | 50 | 30 | 50 | 40 |

TABLE 16

| | Example | | | | | | | |
|---|---|---|---|---|---|---|---|---|
| | 9 | 10 | 11 | 12 | 13 | 14 | 15 | 16 |
| Depth of Warp (μm) | | | | | | | | |
| Room Temp. | 40 | 30 | 30 | 40 | 40 | 50 | 40 | 50 |
| 100° C. | 70 | 90 | 90 | 80 | 70 | 90 | 80 | 90 |
| 150° C. | 40 | 40 | 30 | 30 | 30 | 50 | 40 | 50 |

TABLE 17

| | Example | | | | | | | |
|---|---|---|---|---|---|---|---|---|
| | 17 | 18 | 19 | 20 | 21 | 22 | 23 | 24 |
| Depth of Warp (μm) | | | | | | | | |
| Room Temp. | 40 | 50 | 40 | 30 | 60 | 40 | 50 | 50 |
| 100° C. | 100 | 90 | 80 | 80 | 100 | 80 | 90 | 80 |
| 150° C. | 50 | 60 | 40 | 40 | 50 | 40 | 60 | 30 |

TABLE 18

| | Example | | | | | | | |
|---|---|---|---|---|---|---|---|---|
| | 25 | 26 | 27 | 28 | 29 | 30 | 31 | 32 |
| Depth of Warp (μm) | | | | | | | | |
| Room Temp. | 40 | 30 | 50 | 10 | 10 | 10 | 30 | 40 |
| 100° C. | 90 | 80 | 90 | 0 | 0 | 0 | 80 | 70 |
| 150° C. | 50 | 40 | 40 | 40 | 30 | 30 | 30 | 40 |

TABLE 19

| | Example | | | | | | |
|---|---|---|---|---|---|---|---|
| | 33 | 34 | 35 | 36 | 37 | 38 | 39 |
| Depth of Warp (μm) | | | | | | | |
| Room Temp. | 40 | 30 | 40 | 50 | 40 | 40 | 40 |
| 100° C. | 90 | 80 | 70 | 90 | 80 | 80 | 90 |
| 150° C. | 50 | 40 | 40 | 50 | 40 | 50 | 50 |

TABLE 20

| | Comparative Example | | | |
|---|---|---|---|---|
| | 1 | 2 | 3 | 4 |
| Depth of Warp (μm) | | | | |
| Room Temperature | 220 | 190 | 1,550 | 1,100 |
| 100° C. | 200 | 250 | 1,800 | 1,200 |
| 150° C. | 180 | 80 | 1,100 | 800 |

It can be seen from Tables 9 to 20 that each of the cured resins in the Examples of the present invention has at least two secondary differential peaks of linear thermal expansion by the TMA measurement and the interval between the peaks is at least 20° C. In the semiconductor devices as the products in the Examples of the present invention each using the cured resin, the warped amount was very slight as compared with the semiconductor devices as the products in the Comparative Examples each using the conventional cured resin.

On the semiconductor devices as the products of the Examples of the present invention and as the products of the Comparative Examples, the TCT and the cracking resistant test were carried out. The results obtained are shown in Tables 21 to 27 below.

In the Tables, the results of the TCT and the cracking resistant test described above are shown by the number of cracks occurred in 5 semiconductor devices under the conditions shown below.

Thermal Cycle Test (TCT)

The test was carried out under the conditions of −65° C. (5 minutes) and 150° C. (5 minutes) cycle.

Cracking Resistant Test

After immersing the semiconductor device in a molten solder liquid (260° C.) for 48 hours, 72 hours, or 96 hours, the presence or absence of the occurrence of cracks on the semiconductor was observed.

TABLE 21

(Number of cracked device/5 devices)

| | Example | | | | | | |
|---|---|---|---|---|---|---|---|
| | 1 | 2 | 3 | 4 | 5 | 6 | 7 |
| TCT | | | | | | | |
| Cycle number | | | | | | | |
| 1,000 Times | 0 | 0 | 0 | 0 | 0 | 0 | 0 |
| 2,000 Times | 2 | 1 | 2 | 0 | 2 | 1 | 1 |
| 3,000 Times | 3 | 1 | 2 | 1 | 3 | 1 | 1 |
| CRACKING RESISTANCE | | | | | | | |
| Immersion time | | | | | | | |
| 48 Hours | 0 | 0 | 0 | 0 | 1 | 0 | 0 |
| 72 Hours | 1 | 1 | 2 | 2 | 2 | 1 | 1 |
| 96 Hours | 3 | 2 | 3 | 2 | 3 | 2 | 2 |

TABLE 22

(Number of cracked device/5 devices)

| | EXAMPLE | | | | | | |
|---|---|---|---|---|---|---|---|
| | 8 | 9 | 10 | 11 | 12 | 13 | 14 |
| TCT | | | | | | | |
| Cycle number | | | | | | | |
| 1,000 Cycles | 0 | 0 | 1 | 0 | 0 | 0 | 0 |
| 2,000 Cycles | 0 | 2 | 2 | 2 | 1 | 1 | 1 |
| 3,000 Cycles | 1 | 3 | 4 | 3 | 2 | 2 | 2 |
| CRACKING RESISTANCE | | | | | | | |
| Immersion time | | | | | | | |
| 48 Hours | 0 | 0 | 1 | 0 | 0 | 0 | 0 |
| 72 Hours | 0 | 1 | 2 | 1 | 1 | 1 | 2 |
| 96 Hours | 2 | 1 | 3 | 2 | 2 | 2 | 3 |

TABLE 23

(Number of cracked device/5 devices)

| | Example | | | | | | |
|---|---|---|---|---|---|---|---|
| | 15 | 16 | 17 | 18 | 19 | 20 | 21 |
| TCT | | | | | | | |
| Cycle number | | | | | | | |
| 1,000 Cycles | 1 | 0 | 0 | 0 | 0 | 0 | 0 |
| 2,000 Cycles | 2 | 1 | 1 | 0 | 1 | 0 | 2 |
| 3,000 Cycles | 2 | 1 | 2 | 1 | 2 | 1 | 2 |
| CRACKING RESISTANCE | | | | | | | |
| Immersion time | | | | | | | |
| 48 Hours | 2 | 0 | 0 | 0 | 0 | 0 | 0 |
| 72 Hours | 2 | 1 | 1 | 0 | 1 | 1 | 1 |
| 96 Hours | 3 | 2 | 1 | 2 | 3 | 2 | 3 |

TABLE 24

(Number of cracked device/5 devices)

| | Example | | | | | | |
|---|---|---|---|---|---|---|---|
| | 22 | 23 | 24 | 25 | 26 | 27 | 28 |
| TCT | | | | | | | |
| Cycle number | | | | | | | |
| 1,000 Cycles | 0 | 0 | 0 | 0 | 0 | 0 | 0 |
| 2,000 Cycles | 1 | 2 | 0 | 2 | 1 | 1 | 0 |
| 3,000 Cycles | 1 | 2 | 1 | 3 | 1 | 1 | 1 |
| CRACKING RESISTANCE | | | | | | | |
| Immersion time | | | | | | | |
| 48 Hours | 0 | 0 | 0 | 1 | 0 | 0 | 0 |
| 72 Hours | 1 | 2 | 2 | 2 | 1 | 1 | 0 |
| 96 Hours | 2 | 3 | 2 | 3 | 2 | 2 | 2 |

TABLE 25

(Number of cracked device/5 devices)

| | Example | | | | | | |
|---|---|---|---|---|---|---|---|
| | 29 | 30 | 31 | 32 | 33 | 34 | 35 |
| TCT | | | | | | | |
| Cycle number | | | | | | | |
| 1,000 Cycles | 0 | 1 | 0 | 0 | 0 | 1 | 0 |
| 2,000 Cycles | 2 | 2 | 2 | 1 | 1 | 1 | 1 |
| 3,000 Cycles | 3 | 4 | 3 | 2 | 2 | 3 | 2 |
| CRACKING RESISTANCE | | | | | | | |
| Immersion time | | | | | | | |
| 48 Hours | 0 | 1 | 0 | 0 | 0 | 1 | 0 |
| 72 Hours | 1 | 2 | 1 | 1 | 1 | 1 | 1 |
| 96 Hours | 1 | 3 | 2 | 2 | 3 | 2 | 2 |

TABLE 26

(Number of cracked device/5 devices)

| | Example | | | |
|---|---|---|---|---|
| | 36 | 37 | 38 | 39 |
| TCT | | | | |
| Cycle number | | | | |
| 1,000 Cycles | 0 | 1 | 0 | 0 |
| 2,000 Cycles | 2 | 2 | 2 | 2 |
| 3,000 Cycles | 3 | 4 | 3 | 3 |
| CRACKING RESISTANCE | | | | |
| Immersed time | | | | |
| 48 Hours | 0 | 1 | 0 | 0 |
| 72 Hours | 1 | 2 | 1 | 1 |
| 96 Hours | 1 | 3 | 2 | 1 |

TABLE 27

(Number of cracked device/5 devices)

| | Comparative Example | | | |
|---|---|---|---|---|
| | 1 | 2 | 3 | 4 |
| TCT | | | | |
| Cycle number | | | | |
| 1,000 Cycles | 5 | 5 | 5 | 5 |
| 2,000 Cycles | 5 | 5 | 5 | 5 |
| 3,000 Cycles | 5 | 5 | 5 | 5 |
| CRACKING RESISTANCE | | | | |
| Immersed time | | | | |
| 48 Hours | 5 | 5 | 5 | 5 |
| 72 Hours | 5 | 5 | 5 | 5 |
| 96 Hours | 5 | 5 | 5 | 5 |

It can be seen from the results shown in Tables 21 to 27 above that the semiconductor devices obtained in the Examples of the present invention each has excellent TCT characteristics and excellent cracking resistance. On the other hand, in each of the comparative semiconductor devices obtained in the Comparative Examples, the TCT and the cracking resistance test showed poor results in all the semiconductor devices (5 devices).

While the invention has been described in detail and with reference to specific embodiments thereof, it will be apparent to one skilled in the art that various changes and modifications can be made therein without departing from the spirit and scope thereof.

What is claimed is:

1. A semiconductor device comprising a semiconductor element encapsulated with a cured resin, wherein the cured resin has at least two secondary differential peaks of linear thermal expansion by a thermomechanical analytic measurement and the interval between the peaks is at least 20° C.

2. The semiconductor device as claimed in claim 1, wherein the cured resin is a cured product of a mixture of at least two kinds of resin compositions each having a different glass transition point (Tg) with a temperature difference of at least 20° C.

3. The semiconductor device as claimed in claim 1, wherein the semiconductor element is loaded on a substrate, the semiconductor element on the substrate is encapsulated with the cured resin, and the encapsulation of the semiconductor device is a one-surface encapsulation on only the side of the substrate which loads the semiconductor element.

4. The semiconductor device as claimed in claim 1, wherein the cured resin is a cured product of an epoxy resinphenol resin curing system resin composition.

5. The semiconductor device as claimed in claim 1, wherein the cured resin is a cured resin product of a mixture of following resin composition (a) and resin composition (b), and the organic resin component concentration of the mixture of the resin composition (a) and the resin composition (b) is from 5 to 25% by weight;

(a): A resin composition the cured product of which has a glass transition point (Tg) of from 170° to 250° C., (b): A resin composition the cured product of which has a glass transition point (Tg) of from 100° to 140° C.

* * * * *